United States Patent [19]
Furuhata et al.

[11] Patent Number: 4,967,161
[45] Date of Patent: Oct. 30, 1990

[54] SIGNAL PROCESSING METHOD AND APPARATUS

[75] Inventors: Takashi Furuhata, Kamakura; Hiroaki Takahashi; Manabu Katsuki, both of Yokohama, all of Japan

[73] Assignee: Hitachi, Ltd., Tokyo, Japan

[21] Appl. No.: 393,958

[22] Filed: Aug. 15, 1989

[30] Foreign Application Priority Data

Aug. 24, 1988 [JP] Japan ................... 63-208375

[51] Int. Cl.⁵ .......................... H03K 7/06; H03K 11/0
[52] U.S. Cl. ........................................ 328/22; 328/15; 364/485; 364/725; 364/825
[58] Field of Search ............... 364/553, 725, 825, 826, 364/485; 328/15, 22; 358/332, 334, 328, 329

[56] References Cited

U.S. PATENT DOCUMENTS

| | | | |
|---|---|---|---|
| 3,800,131 | 3/1974 | White | 364/826 |
| 4,282,579 | 8/1981 | Speiser et al. | 364/826 |
| 4,291,330 | 9/1981 | Hirai | 358/328 |
| 4,513,311 | 4/1985 | Hirai et al. | 358/329 |
| 4,771,341 | 9/1988 | Shimizu et al. | 358/329 |
| 4,841,471 | 6/1989 | Sloane | 364/826 |

FOREIGN PATENT DOCUMENTS

| | | |
|---|---|---|
| 53-131814 | 11/1978 | Japan . |
| 53-131815 | 11/1978 | Japan . |
| 53-138212 | 12/1978 | Japan . |
| 59-221126 | 12/1984 | Japan . |
| 60-7279 | 1/1985 | Japan . |

Primary Examiner—Stanley D. Miller
Assistant Examiner—Hanh Thien Nguyen
Attorney, Agent, or Firm—Antonelli, Terry, Stout & Kraus

[57] ABSTRACT

A signal processing method or apparatus in which an input signal is converted to a signal of a predetermined frequency characteristic and the resulting signal is re-converted to a signal of the original frequency characteristic, comprising: a first signal processing section for processing the input signal and having the first transfer function $\exp(-msT)/(1+K\cdot\cos(\omega T))$ or a function approximating to the former function; a second signal processing section cascaded with the first signal processing section for processing the input signal and having a second transfer function of $(1+K\cdot\cos(\omega T)\cdot\exp(-sT))$, the first signal processing section having a linear phase characteristic and including an impedance circuit or an admittance circuit, each circuit including a ladder network of a plurality of inductance elements and capacitance elements.

23 Claims, 6 Drawing Sheets

SIGNAL PROCESSING METHOD AND APPARATUS

BACKGROUND OF THE INVENTION

The present invention relates to the conversion of a signal such as a video signal to a signal of a desired frequency characteristic, and more particularly to a signal processing method and apparatus suitable for improving the S/N ratio and waveform distortion of a signal in a transmission system.

A method of frequency-modulating (FM) a video signal and transmitting (or recording and reproducing) the resulting video signal is generally used in a recording and reproducing apparatus such as a video tape recorder or a video disc player which records and reproduces a video signal, or in a signal transmission medium such as a satellite broadcast. In order to prevent the reduction of the S/N ratio of a signal received in such an FM transmission system, a signal processing method is conventionally used in which a high-frequency region component of the modulated signal is beforehand emphasized, namely, preemphasized, and a high-frequency region component is suppressed or deemphasized after the demodulation of the FM signal.

In order to transmit a signal with high fidelity in such signal processing method, the following equation must be satisfied irrespective of frequency, $$G_1(S) \times G_2(s) = k \quad (1)$$

where $G_1(s)$ is the transfer function of the preemphasis circuit which emphasizes the high-frequency region component of the signal, $G_2(s)$ is the transfer function of a deemphasis circuit which suppresses the high-frequency region component of the signal conversely, $s = j\omega$ where is the angular frequency of the signal, and k is a constant.

Unless equation (1) is satisfied, a phase distortion and an amplitude distortion would be produced in the transmitted (recorded and reproduced) signal, and the reproduced signal would be distorted. A preemphasis circuit and a deemphasis circuit which satisfy the equation (1) and which have the following transfer functions can easily be economically realized using resistors and capacitors, so that they are used very often conventionally, $$\left. \begin{array}{l} G_1(s) = (1 + sT_1)/(1 + sT_2) \\ G_2(s) = (1 + sT_2)/(1 + sT_1) \end{array} \right\} \quad (2)$$

where $$T_1 > T_2$$

In this conventional method, however, the phase characteristics of the preemphasis and deemphasis circuits are not considered.

A method of improving the phase characteristic of the emphasis circuit is well known, as disclosed in Japanese Laid-Open Publications JP-A Nos. 53-131814 and 53-131815 and Japanese Patent Publication JP-B No. 61-8632. These references do not provide a deemphasis method enough to satisfy the equation (1).

A method of improving the S/N ratio of a signal using an emphasis circuit represented by the equation (2) is well known, as disclosed in Japanese Laid-Open Publication JP-A Nos. 59-221126 and 60-7279. Any of these references does not provide means for operation of the deemphasis circuit in a stabilized manner.

The phase characteristic of the emphasis circuit does not provide good linearity according to the conventional methods, as will be obvious from the equation (2), so that if, for example, a square pulse signal is preemphasized, as mentioned above, an overshoot or an undershoot of large amplitude would occur only in the direction of rise or fall of the signal. If frequency modulation is performed using this signal as a modulating signal, a quantity of frequency deviation increases correspondingly to thereby increase the zone which the FM signal occupies to require a wider transmission band. The zone of a signal which can be recorded in a medium is limited by itself in a recording and reproducing device such as a video tape recorder or a video disc player. In the conventional preemphasis system, a large-peak waveform would be produced in one direction for a high-frequency region component of the signal, so that the instantaneous frequency of the FM signal would be extremely high for the overshoot, a signal of high frequencies cannot be sufficiently reproduced due to the band restriction of the medium to thereby produce a so-called inversion (the generation of noise with a black horizontal line in the configuration area in which the video signal changes from black to white). The instantaneous frequency of the FM signal would be extremely lowered for an undershoot to thereby generate beat-like noise in the image configuration area due to a so-called fold of a spectrum to thereby deteriorate the reproduced image quality greatly. In order to prevent this phenomenon, the overshoot and undershoot waveforms of the signal after emphasis are generally clipped (amplitude-limited). By the waveform clipping, part of the signal would be lost, the equation (1) would no longer hold and the reproduced waveform would greatly be distorted. In order to prevent this situation, a method is generally used in which a quality of emphasis is reduced or a quantity of frequency deviation is reduced. Although the waveform distortion is improved, an essential problem would still remain in which the S/N ratio would be deteriorated, of course.

SUMMARY OF THE INVENTION

It is an object of the present invention to provide an emphasis circuit and deemphasis circuit which satisfy the equation (1), has excellent linearity in the phase characteristic, is free from amplitude distortion and phase distortion, and provides a large quantity of emphasis to the signal to improve its S/N ratio.

In order to achieve the above object, a first feature of the present invention is to realize a signal processing apparatus in which a deemphasis circuit has the amplitude characteristic of a function $(1 + K \cdot \cos(\omega T))$ where is the angular frequency, and K is a constant smaller than, or equal to, 1 (unity) and a linear phase characteristic (namely, a flat group delay characteristic), and in which a preemphasis circuit has a linear phase characteristic and an amplitude characteristic approximating to the inverse function $1/(1 + K \cdot \cos(\omega T))$ for the function representing the amplitude characteristic of the deemphasis circuit to thereby satisfy the equation (1) sufficiently.

The second feature of the present invention is that a preemphasis circuit has a linear characteristic and an amplitude characteristic approximating to that of the function $$1-(K\cdot\cos(\omega T))+(K\cdot\cos(\omega T))^2+\ldots +(-1)^m\cdot(K\cdot\cos(\omega T))^m$$

which is obtained by ignoring a term of degree (m+1) (m is a integer) and subsequent terms of higher degrees from the expansion of the function $1/(1+K\cdot\cos(\omega T))$ in geometrical series.

The third feature of the present invention is that the preemphasis circuit includes a first and a second cascaded networks in which the first network has a linear phase characteristic and an amplitude characteristic approximating to that of the first term $(1-K\cdot\cos(\omega T))$ of $$(1-K\cdot\cos(\omega T))\cdot(1+(K\cdot\cos(\omega T))^2)$$

obtained by factorizing the above function wherein m=3 and in which the second network has a linear phase characteristic and an amplitude characteristic approximating to that of the second term $(1+(K\cdot\cos(\omega T))^2)$.

The fourth feature of the present invention is that the deemphasis circuit has a linear phase characteristic and an amplitude characteristic approximating to that of the function $(1+K\cdot\cos(\omega T))$ and using an impedance circuit Z and an admittance circuit Y, each of which has a hyperbolic tangent function tanh (sT) where T is a delay time constant for an angular frequency (s=jω) by constituting a ladder network of inductance elements L and capacitance elements C.

The fifth feature of the present invention is that the preemphasis circuit has a linear phase characteristic and an amplitude characteristic approximating to the geometrical series function $$1-(K\cdot\cos(\omega T))+\ldots(-1)^m\cdot(K\cdot\cos(\omega T))^m$$

by constituting m stage networks having a linear phase characteristic and an amplitude characteristic approximating to the cosine function (K·cos(ωT)), using the impedance circuit Z or admittance circuit Y.

The sixth feature of the present invention is that the preemphasis circuit includes a first and a second cascaded network, the first network having a linear phase characteristic and an amplitude characteristic approximating to the function $(1-K\cdot\cos(\omega T))$ and the second network having a linear phase characteristic and an amplitude characteristic approximating to the function $(1+(K\cdot\cos(\omega T))^2)$, the first and second networks including the impedance circuit Z or admittance circuit Y.

The seventh feature of the present invention is that the preemphasis circuit or deemphasis circuit includes a digital filter using a digital signal processing means.

The eighth feature of the present invention is that the preemphasis circuit is cascaded with a second preemphasis circuit of a function $G_1(s)$ represented by the equation (2), and that the deemphasis circuit is cascaded with a second deemphasis circuit of a function $G_2(s)$ represented by the equation (2).

The preemphasis circuit and the deemphasis circuit have an amplitude characteristic opposite to each other, and a linear phase characteristic. The whole transfer characteristic of this system is linear in phase characteristic. Therefore, no phase distortions are produced. Since the amplitude characteristic is constant irrespective of frequency, no amplitude distortions are produced. Therefore, the signal is transmitted with high fidelity without being subjected to waveform distortions.

The preemphasis circuit operates so as to emphasize the high-frequency region components of the input signal and has a linear phase characteristic, so that the output waveform has the sam symmetry property as the input waveform. More specifically, a preshoot and a postshoot of substantially the same peak level are produced in a odd symmetrical manner before and after each of a rise and a fall edge of a square pulse signal. As just mentioned, the high-frequency region components of the input signal are dispersed substantially equally as a preshoot and a postshoot by emphasis before and after each of the rise and fall edge of the signal. Therefore, the crest value of the signal (peak-to-peak value) is greatly reduced compared to the conventional emphasis system of a non-linear phase characteristic represented by the equation (2). Thus, according to the present invention, in the FM transmission, the transmission band is narrowed, the generation of beat-like noise by the spectral folding and inversion due to overmodulation is suppressed, and the waveform obtained after emphasis need not be clipped compulsively, so that no waveform distortions are produced.

DETAILED DESCRIPTION OF THE PREFERRED EMBODIMENT

Figures 1A, 1B:
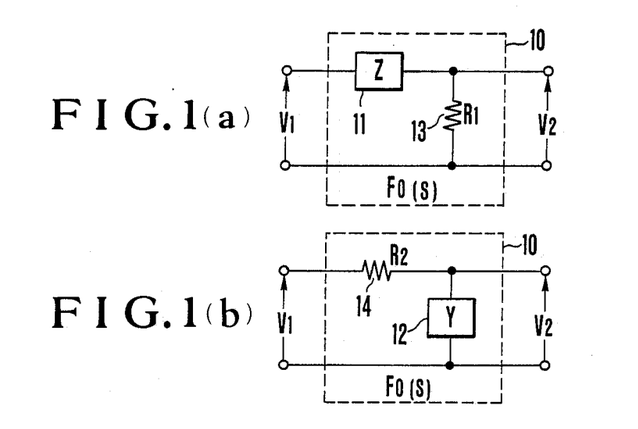
FIG. 1 is a circuit diagram of one embodiment of a cosine circuit according to the present invention.

The present invention will now be described in detail with reference to the drawings showing an embodiment thereof. FIG. 1 shows a four-terminal network as one embodiment of a basic circuit 10 which constitutes a part of a preemphasis circuit or a deemphasis circuit according to one embodiment of the present invention. In FIG. 1(a), reference numeral 11 denotes an impedance circuit Z; and 13, a resistor $R_1$. In FIG. 1(b), reference numeral 12 denotes an admittance circuit Y; and 14, a resistor $R_2$. The impedance circuit Z and admittance circuit Y are each a two-terminal network which approximately realizes a hyperbolic tangent function tanh (sT) and given by the following equation $$Z = \tanh(sT) \times R_0 \\ Y = \tanh(sT)/R_0 \quad \} \quad (3)$$

wherein $R_0$ is a reference resistor.

Figures 2A, 2B:
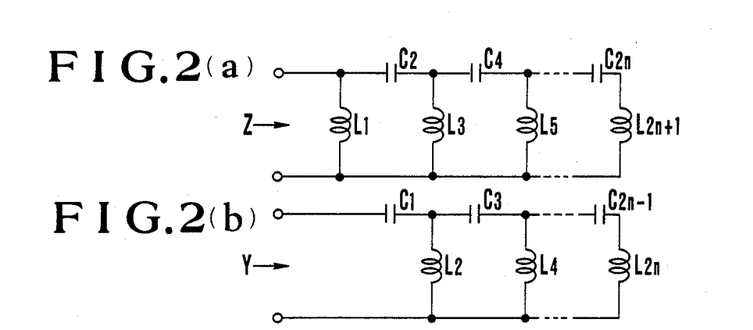
FIG. 2 is a circuit diagram of a specific example of each of an impedance circuit Z and an admittance circuit Y used in the present invention.

The two-terminal networks 11 and 12 which approximately realize the impedance circuit Z and admittance circuit Y, respectively, may be corresponding LC ladder networks shown in FIG. 2 which are known in a reference (Japanese Patent Publication JP-B No. 60-53483) disclosed by the inventors. For reference, the respective values of the inductance elements L and capacitance element C satisfying the equation (3) in FIGS. 2(a) and (b), are given by the following equations. For the impedance Z of FIG. 2(a).

$$L_{2n-1} = \frac{1}{4n-3} \times T \times R_0 \\ C_{2n} = \frac{1}{4n-1} \times \frac{T}{R_0} \quad \} \quad (4)$$

and for the admittance Y of FIG. 2(b), $$L = \frac{1}{4n-1} \times T \times R_0 \\ C_{2n-1} = \frac{1}{4n-3} \times \frac{T}{R_0} \quad \} \quad (5)$$

where n is an integer larger than, or equal to, 1 (unity).

In the four-terminal network 10 of FIG. 1(a), the transfer function $F_0(s)$ of the output voltage $V_2$ to the input voltage $V_1$ is given by the following equation using the equation (3).

$$F_0(s) = \frac{V_2}{V_1} = \frac{1}{1 + Z/R_1} \\ = \frac{1}{1 + (R_0/R_1) \cdot \tanh(sT)} \quad (6)$$

If especially $R_1 = R_0$, the above equation (6) is simplified as follows:

$$F_0(s) = \frac{1 + \exp(-2sT)}{2} \quad (7) \\ = \cos(\omega T) \cdot \exp(-sT)$$

Similarly, the transfer function $F_0(s)$ of the four-terminal network 10 of FIG. 1(b) is given by $$F_0(s) = \frac{V_2}{V_1} = \frac{1}{1 + R_2 \cdot Y} \quad (8) \\ = \frac{1}{1 + (R_2/R_0) \cdot \tanh(sT)}$$

Therefore, if $R_2 = R_0$, the equation (8) is simplified like the equation (7). Since the amplitude characteristic is represented by a cosine function, as will be obvious from the equation (7), the basic circuit 10 is hereinafter referred to as a cosine circuit.

Figure 3:
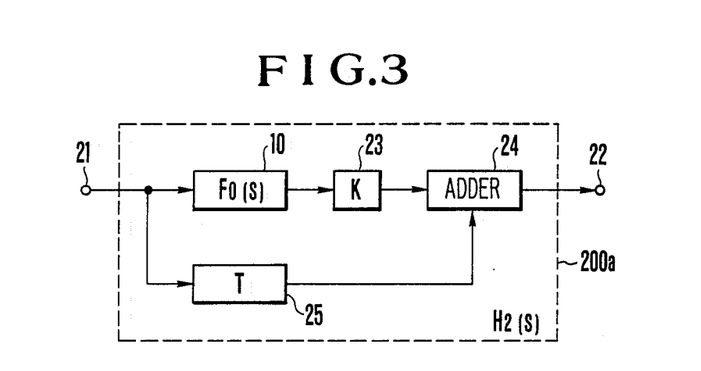
FIG. 3 is a block diagram of one embodiment of a deemphasis circuit according to the present invention and constituted by the cosine circuit.

FIG. 3 is a block diagram of one embodiment of a deemphasis circuit 200a according to the present invention and constituted by a cosine circuit 10 having a transfer function $F_0(s)$ of the equation (7). In FIG. 3, reference numeral 21 denotes a signal input terminal; 22, an output terminal for a signal processed by a deemphasis circuit 200a; 23, a coefficient multiplier; 24, an adder; and 25, a delay circuit. The input signal to the terminal 21 is processed by the cosine circuit 10 having the transfer function $F_0(s)$ of the equation (7), and the resulting output amplitude is multiplied by a factor of K by the coefficient multiplier 23 and supplied to one input to the adder 24, the other input to which is supplied with version of the signal from the terminal 21 delayed by a time of T by the delay circuit 25. The adder 24 adds the output from the coefficient multiplier 23 and the output from the delay circuit 25 and outputs the resulting signal to the terminal 22.

If the transfer function of the delay circuit 25 is given by $$D(s) = \exp(-sT) \quad (9)$$

the above structure gives the transfer function $H_2(s)$ from the input terminal 21 thereof to the output terminal 22 thereof and represented by the following equation using the equations (7) and (9)

$$H_2(s) = D(s) + F_0(s) \cdot K \quad (10) \\ = (1 + K \cdot \cos(\omega T)) \cdot \exp(-sT)$$

Figure 4:
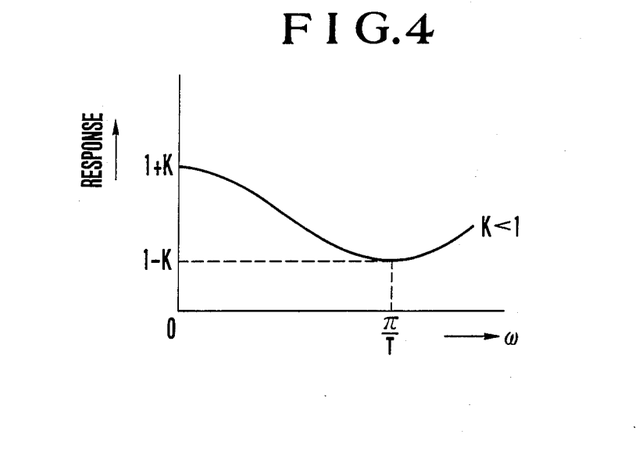
FIG. 4 is a characteristic diagram showing the amplitude characteristic of the deemphasis circuit.

The amplitude characteristic of the deemphasis circuit 200a of FIG. 3 determined by the transfer function $H_2(s)$ is shown by FIG. 4. Thus, if the coefficient value K of the coefficient multiplier 23 is set to a value smaller than 1 (unity), it is obvious that the deemphasis circuit 200a operates so as to suppress the amplitude of the input signal (minimum at $\omega = \pi/T$) in a high-frequency region.

How to realize the preemphasis circuit 100a of an amplitude characteristic $1/(1+k\cdot\cos(\omega T))$ inverse to the deemphasis characteristic represented by the amplitude term $(1+K\cdot\cos(\omega T))$ of the equation (10) will now be described.

As will be obvious from the above description, the coefficient value K of the coefficient multiplier 23 of the deemphasis circuit is set to a value smaller than 1 (unity), so that the following equation holds:

$$|K \cdot \cos(\omega T)| < 1 \quad (11)$$

Therefore, the inverse function for the above function is given by approximate expansion in geometrical series an follows:

$$\frac{1}{1 + K \cdot \cos(\omega T)} = 1 - K \cdot \cos(\omega T) + (K \cdot \cos(\omega T))^2 + \quad (12)$$

$$\ldots + (-1)^m \cdot (K \cdot \cos(\omega T))^m$$

where m is an integer equal to, or larger than, 1 (unity).

The transfer function $H_1(s)$ shown by the following equation will be considered:

$$H_1(s) = \frac{1}{1 + K \cdot \cos(\omega T)} \cdot \exp(-msT) \quad (13)$$

As an example, if the approximation shown by the equation (12) is used in the equation (13) where m=3, the following equation is given:

$$H_1(s) = \exp(-3sT) - (K \cdot \cos(\omega T) \cdot \exp(-sT)) \cdot \quad (14)$$

$$\exp(-2sT) + (K \cdot \cos(\omega T) \cdot \exp(-sT))^2 \cdot$$

$$\exp(-2sT) - (K \cdot \cos(\omega T) \cdot \exp(-sT))^3$$

Substituting the function $F_0(s)$ of the cosine circuit of the equation (7) into the equation (14), we obtain the following equation, $$H_1(s) = \exp(-3T) - K_1 \cdot F_0(s) \cdot \exp(-2T) + \quad (15)$$

$$K_2 \cdot (F_0(s))^2 \cdot \exp(-T) - K_3 \cdot (F_0(s))^2$$

where $$K_1 = K, K_2 = K^2, K_3 = K^3 \quad (16)$$

Figure 5:
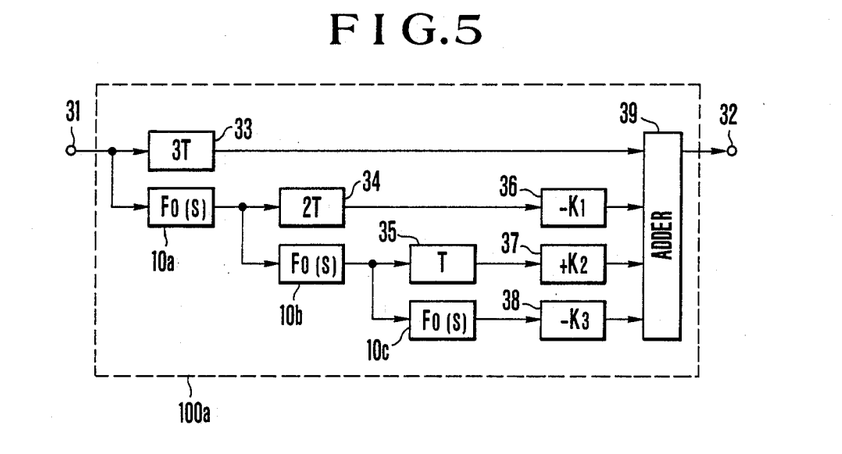
FIG. 5 is a block diagram of one embodiment of a preemphasis circuit according to the present invention and constituted by the cosine circuit.

FIG. 5 is a block diagram of one embodiment of the preemphasis circuit 100a having the transfer function $H_1(s)$ given by the equation (15) and realized using the cosine circuit 10. In FIG. 5, reference numeral 31 denotes a signal input terminal; 32, an output terminal for the preemphasized signal; 10a, 10b, 10c, a cosine circuit constituted by the four-terminal network of FIG. 1 and having the transfer function given by the equation (7); 33, 34, 35, delay circuits having delay times of 3T, 2T and T, respectively, and transfer functions given by exp(−3sT), exp(−2sT) and exp(−sT), respectively; 36, 37, 38, coefficient multipliers having coefficient values of −K₁, +K₂, and −K₃, respectively. A coefficient multiplier having a negative coefficient value of −K_i is constituted by a polarity inverter having an amplification degree K_i; and 39, an adder. The signal from the terminal 31 is delayed by a time of 3T by the delay circuit 33 and then applied to the adder 39. The signal from the terminal 31 is applied to the cosine circuit 10a, the output of which is delayed by a time of 2T by the delay circuit 34, and the delayed signal is then multiplied in amplitude by a factor of −K₁ and supplied to the adder 39. The output from the cosine circuit 10a is further supplied to the cosine circuit 10b, the output of which is delayed by a time of T by the delay circuit 35, and the resulting signal is multiplied in amplitude by a factor of +K₂ by the coefficient multiplier 37 and then supplied to the adder 39. The output from the cosine circuit 10b is also supplied to the cosine circuit 10c, the output of which is multiplied in amplitude by a factor of −K₃ by the coefficient multiplier 38, and then applied to the adder 39. The signals supplied to the adder 39 are added therein and the resulting signal is outputted from the terminal 32. The respective coefficient values of the coefficient multipliers 36, 37 and 38 can be determined as shown in the equation (16). However, since the fourth and subsequent terms of the geometrical series are actually disregarded, an error due to this disregard is involved. The coefficient values of $K_1$, $K_2$, $K_3$ may be set to appropriate values so as to reduce the error such that the inverse $1/(1+K \cdot \cos(\omega T))$ of the deemphasis characteristic is approximated more closely. One example of the coefficient values to reduce the error is $K_1 = 0.5(=k)$, $K_2 = 0.3(>K^2)$, and $K_3 = 0.15(>K^3)$ if $K = 0.5$.

When m=3, the equation (14) is simplified by factorization as follows:

$$H_1(s) = [(1 - K_1 \cdot \cos(\omega T)) \cdot \exp(-sT)] \times \quad (17)$$

$$[(1 + K_2 \cdot \cos^2(\omega T)) \cdot \exp(-2sT)]$$

where $$K_1 = K, K_2 = K^2 \quad (18)$$

Figure 6:
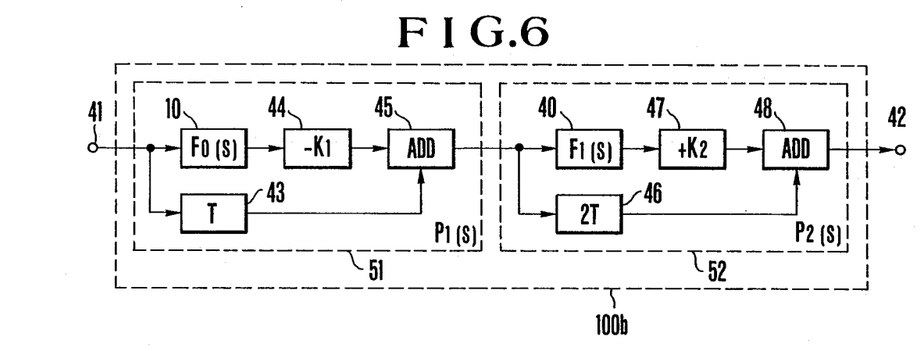
FIG. 6 is a block diagram of another embodiment of the preemphasis circuit according to the present invention.

FIG. 6 shows one embodiment of preemphasis circuit 100b having the transfer function $H_1(s)$ given by the equation (17). In FIG. 6, reference numeral 41 denotes a signal input terminal; and 42, and output terminal for a preemphasized signal. The preemphasis circuit 100b of FIG. 6 includes a first circuit block 51 and a second circuit block 52 cascaded therewith. In the first circuit block 51, reference numeral 10 denotes a cosine circuit constituted by the four-terminal network of FIG. 1, the transfer function of which is represented by the equation (7). Reference numeral 43 denotes a delay circuit having a delay time of T and a transfer function of exp(−sT). Reference numeral 44 denotes a coefficient multiplier having a coefficient value of −K₁; and 45, an adder. The input signal from the terminal 41 is delivered to the cosine circuit 10, the output of which is multiplied in amplitude by a factor of −K₁ by the coefficient multiplier 44, and the resulting output is applied to one input to the adder 45. The signal from the terminal 41 is delayed by a time of T by the delay circuit 43 and then applied to the other input to the adder 45. The adder 45 adds the received signals and supplies its output to the second circuit block 52. The transfer function $P_1(s)$ of the circuit from the input of the first circuit block 51 to its output is given using the equation (7) as follows:

$$P_1(s) = \exp(-sT) - K_1 \cdot F_0(s) \quad (19)$$

$$= (1 - K_1 \cdot \cos(\omega T)) \cdot \exp(-sT)$$

The transfer function $P_1(s)$ coincides with the righthand first term of the transfer function $H_1(s)$ represented by the equation (17).

In the second circuit block 52 of FIG. 6, reference numeral 40 denotes a circuit having a transfer function $F_1(s)$ approximated by the following equation (20), $$F_1(s) = \cos^2(\omega T) \cdot \exp(-2sT) \quad (20)$$

Figure 7:
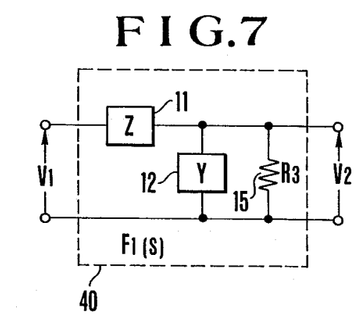
FIG. 7 is a circuit diagram of a square cosine circuit according to the present invention.

The amplitude characteristic of the circuit is represented by the square cosine function, so that the circuit 40 is hereinafter referred to as the square cosine circuit. While the square cosine circuit 40 is easily realized by the two-stage cascaded connection of the first cosine circuits 10 via a buffer amplifier (not shown), FIG. 7 shows a four-terminal network as one embodiment of the square-cosine circuit 40. In FIG. 7, reference numerals 11 and 12 denote an impedance circuit Z and an admittance circuit Y, respectively, which are the same as those used in the cosine circuit of FIG. 1 and given the same reference numeral. Reference numeral 15 denotes a resistor $R_3$. The transfer function $F_1(s)$ as the ratio of the output voltage $V_2$ to the input voltage $V_1$ in the four-terminal network 40 is given by $$F_1(s) = \frac{V_2}{V_1} = \frac{1}{1 + Z/R_3 + Y \cdot Z} \qquad (21)$$

where if $R_3 = R_0/2$, and the above equation is simplified using the equation (3) as follows:

$$F_1(s) = \frac{1}{(1 + \tanh(sT))^2} \qquad (22)$$
$$= \cos^2(\omega T) \cdot \exp(-2sT)$$

This equation coincides with the equation (20) so that the square cosine circuit 40 is realized.

In the second circuit block 52 shown in FIG. 6, reference numeral 46 denotes a delay circuit having a delay time of 2T, and a transfer function represented by $\exp(-2sT)$. Reference numeral 47 denotes a coefficient multiplier having a coefficient value of $+K_2$; and 48, an adder. The output from the first block 51 is delivered to the square cosine circuit 40 and delay circuit 46. The output from the square cosine circuit 40 is multiplied in amplitude by a factor of $+K_2$ by the coefficient multiplier 47 and then supplied to one input to the adder 48, the other input of which is supplied with a 2T-delayed signal from the delay circuit 46. The signals delivered to the adder 48 are added therein and the resulting output is supplied to the terminal 42. The transfer function $P_2(s)$ between the input and output of the second circuit block 52 is represented using the equation (20) as follows:

$$P_2(s) = \exp(-2sT) + K_2 \cdot F_1(s) \qquad (23)$$
$$= (1 + K_2 \cdot \cos^2(\omega t)) \cdot \exp(-2sT)$$

The transfer function $P_2(s)$ coincides with the righthand second term of the transfer function $H_1(s)$ shown by the equation (17).

In the preemphasis circuit 100b shown in FIG. 6, the first circuit block 51 having the transfer function $P_1(s)$ of the equation (19) and the second circuit block having the transfer function $P_2(s)$ of the equation (23) are cascaded, so that the whole transfer function $H_1(s)$ of the preemphasis circuit 100b is given by $$\begin{aligned} H_1(s) &= P_1(s) \cdot P_2(s) \\ &= [(1 - K_1 \cdot \cos(\omega T)) \cdot \exp(-sT)] \times \\ &\quad [(1 - K_1 \cdot \cos^2(\omega T)) \cdot \exp(-2sT)] \end{aligned} \qquad (24)$$

This equation coincides with the equation (17). Therefore, a desired preemphasis circuit is realized having an amplitude characteristic $1/(1 + K \cdot \cos(\omega T))$ which is the inverse of the amplitude characteristic $â1 + K \cdot \cos(\omega T))$ of the deemphasis circuit having the transfer function $H_2(s)$ represented by the equation (10).

In the preemphasis circuit 100b shown in FIG. 6, the respective coefficient values of the coefficient multipliers 44 and 47 are required to have values shown in the equation 18. Actually, the equation (17) (and the equation (24)) involve an error due to disregard of the fourth and subsequent terms of the geometrical series. The coefficient values $K_1$ and $K_2$ may be set so as to reduce the error. Specifically, when, for example, $K=0.5$, and if $K_1$ is set to $K$ ($K_1=0.5$), and $K_2$ is set to a value larger than $K_2(K_2=0.3)$ the inverse of the deemphasis characteristic will be more closely approximated.

Figure 8:
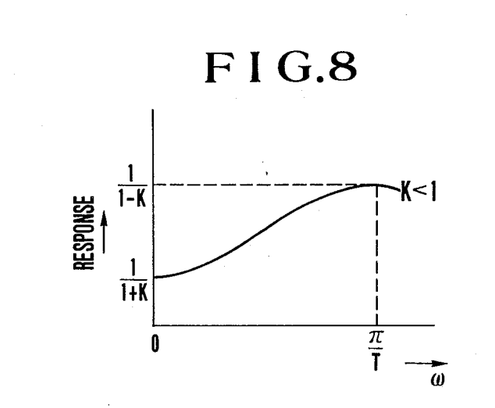
FIG. 8 is a diagram of the amplitude characteristic of the preemphasis circuit.

FIG. 8 shows the amplitude characteristic of the preemphasis circuits of FIGS. 5 and 6. The preemphasis characteristic of FIG. 8 is the inverse of the deemphasis characteristic of FIG. 4, of course.

Figures 9A, 9B:
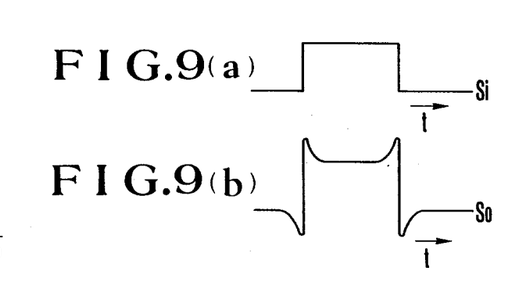
FIG. 9 is a diagram of the response waveform of the preemphasis circuit.

FIG. 9 shows the response waveform of the preemphasis circuits of FIGS. 5 and 6 to an input signal $S_i$. FIG. 9(a) shows the waveform of the input signal $S_i$ and FIG. 9(b) the waveform of the output signal $S_o$. As shown, the response waveform to an input square pulse signal generates a preshoot and a postshoot in odd symmetry in the vicinity of the rise and fall edges of the signal and having substantially the same peak level. The high-frequency region components of the input signal $S_i$ are equally dispersed to the preshoot and postshoot by emphasis, so that the peak-to-peak value of the output signal $S_o$ is small compared to the conventional emphasis system shown by the equation (2).

Therefore, when the thus processed and output signal $S_o$ is subjected to frequency modulation and transmitted (or recorded and reproduced), the deviation of frequency is suppressed to a small value, so that the band occupied by the FM signal is correspondingly reduced and difficult to be restricted by the transmission band. Since overmodulation is prevented, an inversion and generation of spurious radiations due to the fold of the spectrum are suppressed, and compulsive clipping of the waveform is not required, so that no waveform distortions are produced.

If a system is constituted in which (1) a signal to be transmitted (or recorded and reproduced) is preemphasized by the preemphasis circuit shown in FIGS. 5 or 6 according to the present invention, frequency-modulated and transmitted (or recorded and reproduced), (2) the received signal (or reproduced signal) is frequency-demodulated, and deemphasized by the deemphasis circuit of FIG. 3 according to the present invention, and (3) the original signal is recovered, the whole transfer characteristic of the transmission system is given by the following equation using the equations (13) and (14), $$H_1(s) \times H_2(s) = \exp(-(1+m)sT) \qquad (25)$$

According to the whole transfer characteristic of this system, constant delay time of $(1+m) \cdot T$ only is given and the phase characteristic is linear to thereby generate no phase distortions. Since the amplitude characteristic is constant irrespective of frequency, no amplitude distortions are produced. Therefore, the signal is transmitted with high fidelity or with no distortions, noise influencing the signal in the transmission path is suppressed corresponding to a quantity of emphasis which, in turn, corresponds to the value of K, and the ratio of S/N is improved.

While any of the above embodiments is illustrated as employing the LC ladder network shown in FIG. 2, namely, an analog processing circuit, the present invention is not restricted to it. The signal processor may be constituted by a so-called digital filter using digital processing means.

Figure 10:
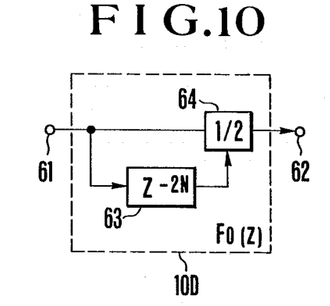
FIG. 10 is a block diagram of another embodiment of the cosine circuit.

FIG. 10 shows one embodiment of a digital cosine circuit 10D in which the cosine circuit 10 of FIG. 1 is constituted by a digital filter.

Figure 11:
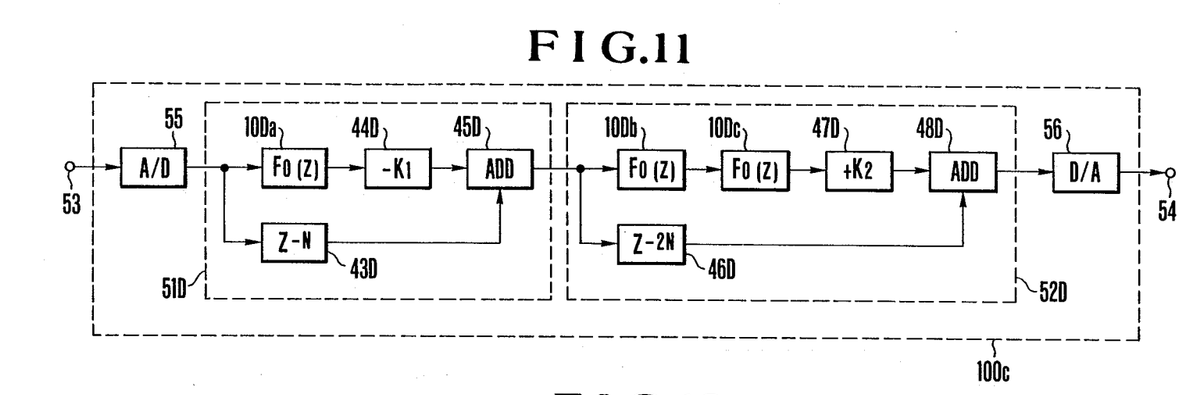
FIG. 11 is a block diagram of another embodiment of the preemphasis circuit according to the present invention.

In order to convert an analog filter to a digital filter, a process is known which uses a bilinear Z-transformation given by $$S = \frac{2}{T_0} \cdot \frac{1 - Z^{-1}}{1 + Z^{-1}} \tag{26}$$

where $Z = \exp(sT_0)$ where $T_0$ is the period of a sampling clock signal in the digital signal processing system. Substituting the equation (26) into the transfer function $F_0(s)$ of the equation (7), we obtain the following equation $$F_0(Z) = \frac{1 + Z^{-2}}{2} \tag{27}$$

where $N = T/T_0$. The embodiment of FIG. 10 has a transfer function equal to $F_0(Z)$ of the equation (27). In FIG. 10, reference numeral 61 denotes an input terminal for a digital signal to which an analog signal is converted by an A/D converter (not shown) in accordance with a sampling clock signal; and 62, an output terminal for a digital signal from the digital cosine circuit 10D. Reference numeral 63 denotes a digital delay circuit; and 64, a digital adder. The input signal from the terminal 61 is delayed by 2N bits (corresponding to a time of 2T) by the delay circuit 63. The signal delay is performed by the sampling clock signal (not shown). The adder 64 digitally adds the output signal from the delay circuit 63 and the input signal from the terminal 61, the resulting output is multiplied by a factor of ½, and the output digital signal is output from the terminal 62.

Figure 12:
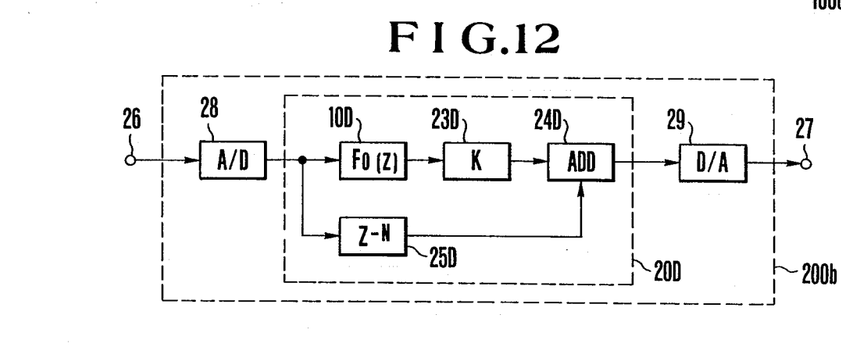
FIG. 12 is a block diagram of another embodiment of the deemphasis circuit according to the present invention.

FIG. 11 shows an embodiment of a digital processing-type preemphasis circuit 100c which includes an analog processing-type preemphasis circuit shown in FIG. 6 to which the digital cosine circuit 10D of FIG. 10 is applied. In FIG. 11, reference numeral 55 denotes A/D converter; 56, a D/A converter; 10Da, 10Db, 10Dc, a digital cosine circuit of the same structure as that shown in FIG. 10; 43D, 46D, digital delay circuits which delay input signals by N bits (corresponding to a time of T) and 2N bits (corresponding to a time of 2T), respectively. Reference numerals 44D, 47D denote digital coefficient multipliers having coefficient values of $=K_1$ and $+K_2$, respectively. Reference numerals 45D, 48D denote a digital adder. The circuit blocks 51D and 52D shown in FIG. 11 correspond to the circuit blocks 51 and 52, respectively, of FIG. 6. Signal processing is effected analogly in FIG. 6 while it is digitally in FIG. 11, the basic operation of those circuits are quite the same, and further description thereof will be omitted. The embodiment shown in FIG. 11 realizes a square cosine circuit which comprises cascaded cosine circuits 10Db and 10Dc instead of the square cosine circuit 40 of FIG. 6, and the operations of the both circuits are quite the same. The analog signal from the terminal 53 is converted to a digital signal by the A/D converter 55, the output of which is digitally processed sequentially by the circuit blocks 51D and 52D. The output digital signal from the circuit block 52D is converted by the D/A converter 56 to an analog signal, which is then output to the terminal 54. In FIGS. 6 and 11, the circuit blocks 51, 52 and 51D, 52D are only required to be cascaded, and the order of cascaded blocks may be reversed in order to produce the same effect.

Similarly, FIG. 12 shows one embodiment of a digital processing type deemphasis circuit 200b which includes the analog processing type deemphasis circuit shown in FIG. 3 to which the digital cosine circuit 10D shown in FIG. 10 is applied. In FIG. 12, reference numeral 28 denotes an A/D converter; 29, a D/A converter; 23D, a digital coefficient multiplier having a coefficient value of K; 24D, a digital adder; and 25D, a digital delay circuit which delays the signal by N bits (corresponding to a time of T). The circuit block 20D shown in FIG. 12 is quite the same in basic operation as the circuit block 200a and further description thereof will be omitted. The analog signal from the terminal 26 is converted by the A/D converter 28 to a digital signal, which is then digitally processed by the circuit block 20D. The output digital signal from the circuit block 20D is converted by the D/A converter 29 to an analog signal, which is then output to the terminal 27.

Figure 13:
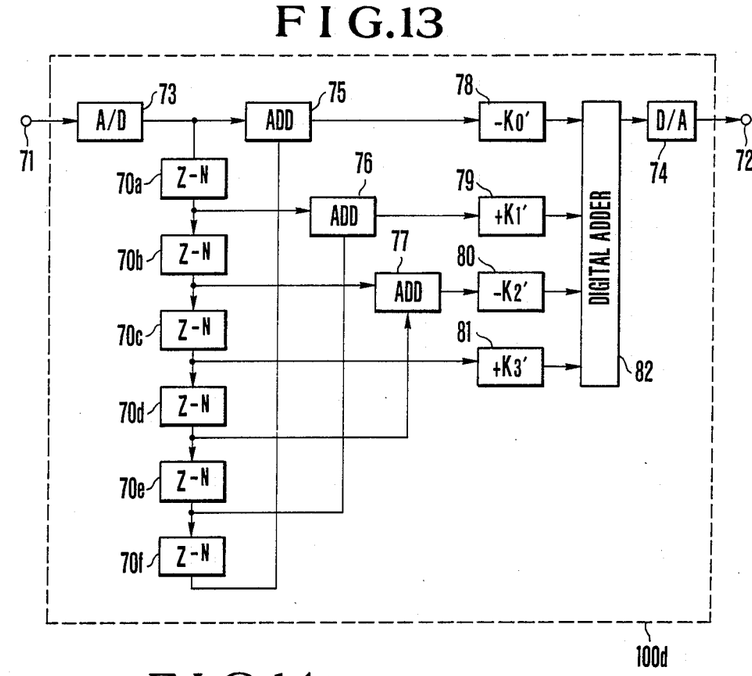
FIG. 13 is a block diagram of a further embodiment of the preemphasis circuit according to the present invention.

Substituting the equation (26) into the equation (14), we obtain the following equation, $$H_1(z) = -K_0' + K_1' \cdot Z^{-N} - K_2 \cdot Z^{-2N} + K_3' \cdot Z^{-3N} \\ -K_2' \cdot Z^{-4N} + K_1' \cdot Z^{-5N} - K_0' \cdot Z^{-4N} \tag{28}$$

where $$K_0' = K^3/8, K_1' = K^2/4, \\ K_2' = K/2 + 3K^3/8, K_3' = 1 + K^2/2 \tag{29}$$

FIG. 13 shows another embodiment of the preemphasis circuit 100d having the transfer function $H_1(Z)$ of the equation (28). In FIG. 13, reference numeral 73 denotes an A/D converter; 74, a D/A converter; 75, 76, 77, a digital adder; 78, 79, 80, 81, digital coefficient multipliers having coefficient values of $-K'_0$, $+K'_1$, $-K_2$, $+K'_3$, respectively; 82, a digital adder; 70a, 70b, 70c, 70d, 70e, 70f, a digital delay circuit which delays the signal by N bits (corresponding to a time of T). The analog signal from the terminal 71 is converted by the A/D converter 73 to a digital signal, which is then delayed by N bits sequentially by the respective delay circuits 70a–70f, namely, 6N bits in total. The adder 75 adds the output from the A/D converter 73 and the output from the delay circuit 70f. The adder 76 adds the outputs from the delay circuits 70a and 70b. The adder 77 adds the outputs from the delay circuits 70b and 70d. The output from the adder 75 is multiplied in amplitude by a factor of $-K'_0$ by the coefficient multiplier 78, the output from the adder 76 is multiplied by a factor of $+K'_1$ by the coefficient multiplier 79, the output from the adder 77 is multiplied by a factor of $-K'_2$ by the coefficient multiplier 80, and the output from the delay circuit 70c is multiplied by a factor of $+K'_3$ by the coefficient multiplier 81. The respective outputs from the coefficient multipliers 78–81 are all added by the adder 82, the output from which is converted by the D/A converter 74 to an analog signal, which is then output to the terminal 72. The respective coefficient values of the coefficient multipliers 78–81 are set as shown in the equation (29). Actually, the respective coefficient values of $K'_0-K'_3$ may be set so as to reduce an error involved due to the disregard of the fourth and subsequent terms of the geometrical series concerned. Thus the inverse of the deemphasis characteristic is approximated further closely and waveform distortions are further reduced. As a specified example, $K'_0=0.019$, $K'_1=0.075$, $K'_2=0.306$ and $K'_3=1.15$ are set when $K=0.5$.

As described above, the present invention is characterized by a signal processor which realizes the equation (14), (17) or (24) which is approximated to the expansion, in the geometrical series, of the basic function represented by the equation (13). The signal processor includes a preemphasis circuit having a linear phase characteristic and an amplitude characteristic which comprises the inverse of the characteristic of the basic function $H_2(s)$ of the deemphasis circuit represented by the equation (10). Thus, the whole transfer characteristic shown by the equation (25) is obtained and the signal is transmitted with high fidelity. FIG. 14 shows another embodiment of the preemphasis circuit and deemphasis circuit according to the present invention and maintaining the basic concept, just mentioned above.

Substituting into the equation (25) the basic function $H_2(s)$ of the deemphasis circuit of the equation (10) realized by the embodiment shown in FIG. 3 (or in FIG. 12) and the basic function $H_1(s)$ of the preemphasis circuit of the equation (17) realized by the embodiment shown in FIG. 6 (or in FIG. 11), we obtain the following relationship $$H'_1(s) \times H'_2(s) = \exp(-4sT) \quad (30)$$

where
$$H'_1(s) = (1 - K_1 \cdot \cos(\omega T)) \cdot \exp(-sT)$$

$$H_2(s) = [(1 + K_2 \cdot \cos^2(\omega T)) \cdot \exp(-2T)] \times [(1 + K \cdot \cos(\omega T)) \cdot \exp(-sT)]$$

$$m = 3 \quad (31)$$

Figure 14A:
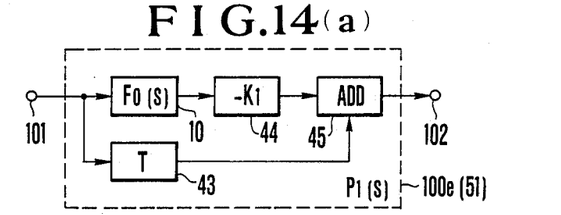
FIG. 14 is a block diagram of a further embodiment of the preemphasis circuit and deemphasis circuit according to the present invention.
Figure 14B:
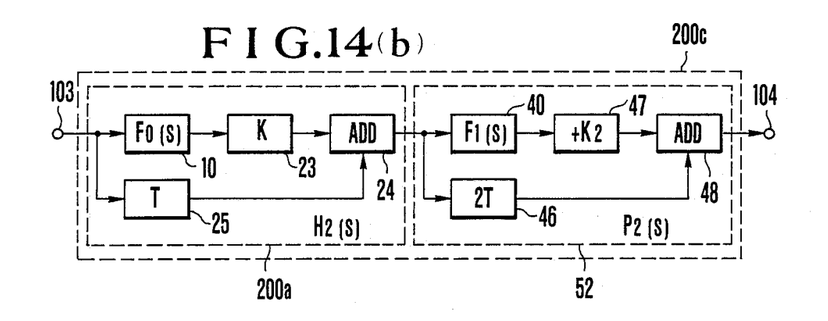

Even if the new basic functions $H'_1(s)$ and $H'_2(s)$ defined by the equation (31) are used instead of the basic functions $H_1(s)$ and $H_2(s)$, the equation (30) which shows the conditions for high-fidelity signal transmission holds. The first new basic function $H'_1(s)$ has a preemphasis characteristic in which the amplitude is emphasized in a high-frequency region as in FIG. 8 while the second new basic function $H'_2(s)$ has a deemphasis characteristic in which the amplitude is suppressed in a high-frequency region as in FIG. 4.

FIG. 14(a) is a block diagram of another embodiment of the preemphasis circuit 100e in which the function $H'_1(s)$ is realized, and FIG. 14(b) is a block diagram of another embodiment of the deemphasis circuit 200c in which the function $H'_2(s)$ is realized.

The basic function $H'_1(s)$ represented by the equation (31) coincides with the function $P_1(s)$ of the equation (19) ($H'_1(s) = P_1(s)$) Thus, the preemphasis circuit shown in FIG. 14(a) is realized by quite the same structure as the circuit block 51 shown in FIG. 6. Therefore, these circuits are both identified by the same reference numeral. The basic function $H'_2(s)$ represented by the equation (31) coincides with the product of the basic function $H_2(s)$ represented by the equation (10) and the function $P_2(s)$ represented by the equation (23) ($H'_2(s) = H_2(s) \, P_2(s)$). Thus, the deemphasis circuit shown in FIG. 14(b) is constituted by cascaded connection of the circuit block 200a shown in FIG. 3 and the circuit block 52 of FIG. 6 (the order of the connection may be reversed). Therefore, these circuit blocks are identified by the same reference numeral. While the analog processing is illustrated in the embodiment of FIG. 14, the preemphasis circuit and deemphasis circuit of a digital processing type which are quite the same in operation and effect as those in FIG. 14 are constituted by using the digital processing circuit blocks 51D, 20D and 52D instead of the circuit blocks 51, 200a and 52 of the embodiment shown in FIG. 14.

As described above, in the present invention, both of the preemphasis circuit and deemphasis circuit may be realized by one of the analog and digital processing systems. As shown in the embodiment of FIG. 3 or FIG. 14(b), the deemphasis circuit is relatively easily constituted by an analog processing system so as to perform the most stabilized operation.

Assume that a video signal is applied to the preemphasis circuit and deemphasis circuit. If the preemphasis circuit and deemphasis circuit are constituted by a digital processing circuit, the sampling clock signal (not shown) for signal processing purposes is required to be generated synchronously with a synchronizing signal of the video signal. To this end, the synchronizing signal of the video signal must be separated in a stabilized manner. It is easy to separate the synchronizing signal in a stabilized manner from the video signal input to the preemphasis circuit. Thus, the preemphasis circuit can be easily constituted by a digital processor. The signal in the preemphasis circuit is digitally processed to thereby provide a desired characteristic with high accuracy. However, the video signal preemphasized by the preemphasis circuit has sharp high peaks in the vicinity of the rise and fall as shown in FIG. 9, so that it is generally difficult to identify and separate the synchronizing signal in a stabilized manner from the preemphasized video signal. If, however, the deemphasis circuit to which the preemphasized video signal is input is constituted by an analog processor of the embodiment shown in FIG. 3 or FIG. 14(b), the identification and separation of the synchronizing signal are unnecessary and a stable system with high fidelity is constituted.

As shown in FIG. 9, the waveform preemphasized by the preemphasis circuit according to the present invention is equally dispersed to the preshoot and postshoot due to the emphasis on the high-frequency region of the signal, and the peak-to-peak value of the signal is reduced compared to that due to the conventional emphasis system shown in the equation (2). Namely, under the conditions where the peak-to-peak value of the signal whose high-frequency region is emphasized, which is determined by the conditions of the band, etc., of the transmission path is maintained at a constant value, a quantity of emphasis is further increased according to the present system compared to the conventional system, and the ratio of S/N is improved correspondingly.

Figure 15A:
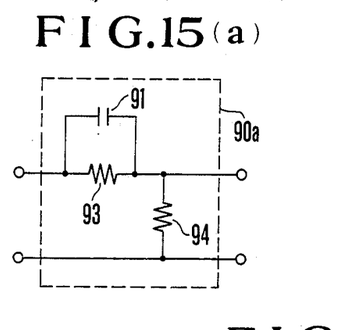
FIG. 15 is a circuit diagram of one embodiment of a further emphasis circuit used together with the emphasis circuit according to the present invention.
Figure 15B:
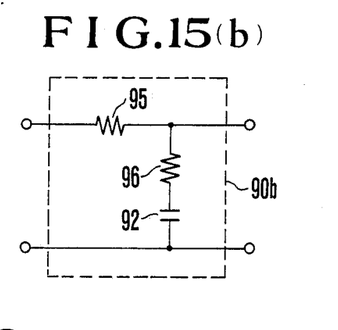

The easiest process for increasing the quantity of emphasis is to set the coefficient of K to a large value infinitely close to 1 (unity). Another process for increasing a quantity of emphasis is to use a conventional circuit additionally. More specifically, the conventional preemphasis circuit 90a and deemphasis circuit 90b having the transfer functions $G_1(s)$ and $G_2(s)$, respectively, represented by the equation (2) may be used together with the preemphasis circuit and deemphasis circuit according to the present invention. In FIG. 15, reference numerals 91, 92 denote a capacitor; and 93-96, a resistor. The conventional preemphasis circuit 90a of FIG. 15(a) may be cascaded with the inventive preemphasis circuit shown in the embodiment of FIG. 5, 6, 11, 13 or 14(a), and the conventional deemphasis circuit 90b of FIG. 19(b) may be cascaded with the inventive deemphasis circuit shown in FIGS. 3, 12 or 14(b) so as to constitute a deemphasis system.

In the above arrangement, if the time constants $T_1$ and $T_2$ of FIG. 2 (determined by the values of capacitors 91, 92 and resistors 93, 94; 95, 96 of FIG. 15) are set to relatively large values, the preemphasis circuit having the transfer function $G_1(s)$ is used mainly to emphasize the low-frequency region of the signal, and the other preemphasis circuit having the transfer function $H_1(s)$ or $H'_1(s)$ is mainly used to emphasize the high-frequency region of the signal. As a result, the quantity of emphasis can be increased over a wide frequency range and the S/N ratio of the signal is improved with no waveform distortions.

The transfer function of the equation (28) realized by the embodiment of FIG. 13 corresponds to m=3, and the equation (28) is generally expressed using any integer m as follows;

$$H_1(z) = \sum_{i=0}^{m} (-1)^{m+i} \cdot k_1 \cdot [Z^{-iN} + Z^{-(2m-i)N}] \quad (32)$$

where $k_1$ is a constant.... (32)

Substituting the equation (26) into the equation (32), we obtain the following equation $$H_1(s) = \sum_{i=0}^{m} (-1)^{m+i} \cdot k_i \cdot [\exp(-isT) + \exp(-(2m - i)sT)] \quad (33)$$

The general transfer function of a digital processing preemphasis circuit according to the present invention is shown by the equation (32) and the equation (33) shows the general transfer function of an analog processing system preemphasis circuit. Any one of these preemphasis circuits is generally constituted by cascading 2m delay circuits having a delay time of T as in FIG. 13 and falls within the scope of the present invention.

The essential of the present invention lies in that the respective coefficient values $K$, $K_1$, $K_2$, $K_3$, $K'_0$, $K'_1$, $K'_2$, $K'_3$, $K_i$ in the preemphasis circuit and deemphasis circuit are set so as to satisfy the equation (25) or (30) to thereby minimize waveform distortions, but the present invention is not restricted to it. For example, when the preemphasis circuit has a predetermined quantity of preemphasis, the quantity of deemphasis by the deemphasis circuit may be changeable. Specifically, the coefficient value K in the coefficient multiplier 23 or 23D shown in FIG. 3 or FIG. 12 may be changeable, or at least one of the coefficient values K and $K_2$ of the coefficient multipliers 23 and 47 shown in the embodiment of FIG. 14(b) may be changeable such that the frequency characteristic of the whole system is changed with no waveform distortions. As a result, the deemphasis circuit is advantageously used economically without any increase in the circuit scale as means for adjusting the frequency characteristic, which also satisfies the present invention.

Figure 16:
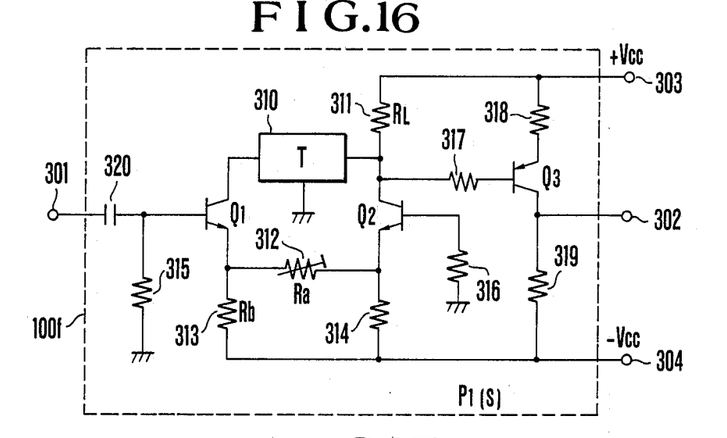
FIG. 16 is a circuit diagram of another embodiment of the preemphasis circuit according to the present invention.

While the embodiments of FIGS. 3, 6 and 14 are shown as being constituted by the cosine circuit shown in the embodiment of FIG. 1, the present invention is not restricted to them.

Figure 17:
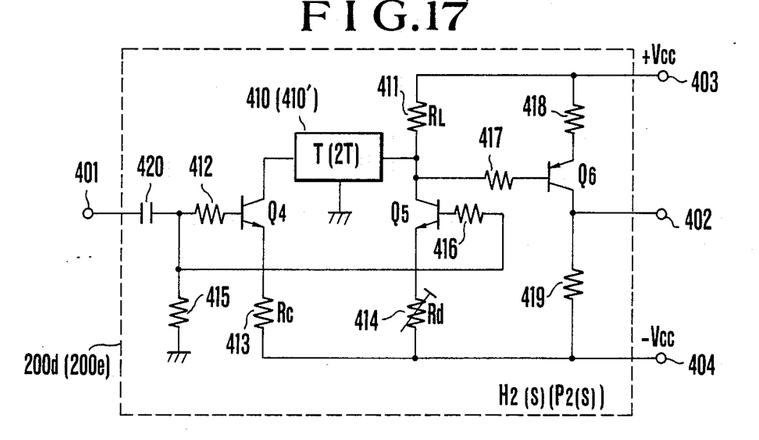
FIG. 17 is a circuit diagram of a further embodiment of deemphasis circuit according to the present invention.

FIG. 16 shows another embodiment of a circuit structure which realizes the basic function $H'_1(s)$ ($=P_1(s)$) of the preemphasis characteristic according to the present invention and shown in the equation (31). In FIG. 16, reference numeral 301 denotes a signal input terminal; 302, an output terminal for a signal preemphasized by a circuit block 100f; and 303, 304, terminals for supply of power source voltages of +Vcc and −Vcc, respectively. Reference characters $Q_1$–$Q_3$ denote a transistor. Reference numerals 310 denotes a delay circuit having a delay time of T; 311-319, a resistor; and 320, a capacitor. The value of the resistor 311 is set to a value equal to the characteristic impedance $R_L$ of the delay circuit 310. The resistor 311 is connected as a collector load resistor to the transistor $Q_2$ and also as a terminating resistor of the delay circuit 310 on the output side of the delay circuit 310. The input terminal of the delay circuit 310 is connected to the collector of the transistor $Q_1$. The emitters of the transistors $Q_1$ and $Q_2$ are connected to the resistors 313 and 314, respectively, and grounded through a resistor 312. The base of the transistor $Q_2$ is grounded, and the base of the transistor $Q_1$ is supplied with an input signal from the terminal 301 via the capacitor 320. The output from the collector of the transistor $Q_2$ is inverted and amplified by the transistor $Q_3$ and the resulting signal is output from the collector of the transistor $Q_3$ to the terminal 302. The transfer function of the circuit block 100f is approximated by $H'_1(s)$ of the equation (31) (or $P_1(s)$ of the equation (19)). The coefficient value $K_1$ of the transfer function $H'_1(s)$ ($=P_1(s)$) having the preemphasis characteristic is given by $$K_1 = \frac{Rb}{Ra + Rb} \quad (34)$$

where Ra and Rb are the values of the resistors 312 and 313, respectively.

FIG. 17 shows another embodiment which realizes the basic function $H_2(s)$ ($=P_1(s)$) of the deemphasis characteristic according to the present invention and shown in the equation (10). In FIG. 17, reference numeral 401 denotes a signal input terminal; 402, an output terminal for a signal deemphasized by a circuit block 200d; and 403, 404, terminals for supply of power source voltages of +Vcc and −Vcc, respectively. Reference characters $Q_4$–$Q_6$ denote a transistor. Reference numerals 410 denotes a delay circuit having a delay time of T; 411-419, a resistor; and 420, a capacitor. The value of the resistor 411 is set to a value equal to the characteristic impedance $R_L$ of the delay circuit 410. The resistor 411 is connected as a collector load resistor to the transistor $Q_5$ and also as a terminating resistor of the delay circuit 410 on the output side of the delay circuit 410. The input terminal of the delay circuit 410 is connected to the collector of the transistor $Q_4$. The emitters of the transistors $Q_4$ and $Q_5$ are connected to the resistors 413 and 414, respectively.

The input signal from the terminal 401 is supplied to the basis of the transistors $Q_4$ and $Q_5$ via the capacitor 420.

The output from the collector of the transistor $Q_5$ is inverted and amplified by the transistor $Q_6$ and the resulting signal is output from the collector of the transistor $Q_6$ to the terminal 402.

The transfer function of the circuit block 200d is approximated by $H_2(s)$ of the equation (10). The coefficient value K of the transfer function $H_2(s)$ having the deemphasis characteristic is given by $$K = \frac{Rc}{Rd} \tag{35}$$

where Rc and Rd are the values of the resistors 413 and 414, respectively.

The basic function $P_2(s)$ of the deemphasis characteristic according to the present invention as shown by the equation (23) is modified as follows:

$$P_2(s) = Ka \cdot (1 + Kb \cdot \cos(\omega 2T)) \exp(-2sT) \tag{36}$$

where $$Ka = 1 + K_2/2$$

$$Kb = K_2/2(1 + K_2/2)$$

This equation coincides with an equation obtained by replacing T with 2T, and K with Kb in the basic function $H_2(s)$ of the equation (10). From this, the basic function $P_2(s)$ is realized by a structure similar to that of FIG. 17. More specifically, to this end, a delay circuit 410' having a delay time of 2T is used instead of the delay circuit 410 in the circuit block 200e of FIG. 17 and the values of the resistors 413 and 414 are set so as to satisfy $$Kb = \frac{Rc}{Rd} \tag{37}$$

From the above, the circuit block 200d of FIG. 17 may be used instead of the circuit block 200a of FIG. 3, the circuit block 100f of FIG. 16 may be used instead of the circuit block 51 of FIG. 6, the circuit block 200e of FIG. 17 may be used instead of the circuit block 52 of FIG. 6, the circuit block 100f of FIG. 16 may be used instead of the circuit block 100e of FIG. 14, the circuit block 200d of FIG. 17 may be used instead of the circuit block 200a of FIG. 14, or the circuit block 200e of FIG. 17 may be used instead of the circuit block 52 of FIG. 14. The same effect is produced by any of these cases.

As described above, according to the present invention, a preemphasis circuit which converts a signal to be transmitted or recorded and reproduced to a signal having a linear phase characteristic and a desired amplitude characteristic and which emphasizes the amplitude of the signal in its medium-frequency region or high-frequency region, and a deemphasis circuit which has a linear phase characteristic and an amplitude characteristic which comprises the inverse of that of the preemphasis circuit and which sufficiently matches with the preemphasis circuit over a wide frequency range are realized with a relatively simple structure. These circuits are easily constituted by a digital circuit. Digitalization serves to improve the accuracy and stability of signal processing and to facilitate the integration of circuits. If the present invention is applied to an FM transmission system, a quantity of frequency deviation is increased without the extension of the transmission band. Means for clipping the waveform to prevent overmodulation is rendered unnecessary, waveform distortions are eliminated, and the ratio of S/N is improved.

The present invention may be carried out even in other modifications of the embodiments without departing from the spirit and main features thereof. Therefore, the above embodiments are only illustrative of the present invention in all respects and should not be construed as being restrictive of the present invention. The scope of the present invention is defined by the attached claims. The modifications and changes belonging to an equivalent of the scope of the claims should fall within the scope of the present invention.

What is claimed is:

1. A signal processing method in which an input signal of a first frequency characteristic is converted to a signal of a second predetermined frequency characteristic, and the resulting signal is reconverted to a signal of the first original frequency characteristic, comprising:

(a) first signal processing means
      (1) having as a first transfer function the function $$\exp(-msT)/(1 + K \cdot \cos(\omega T))$$

where $\omega$ is the angular frequency of the input signal, s is the complex angular frequency of $j\omega$, T is a constant having the unit of time, K is a constant equal to, or smaller than, 1 (unity) and m is an integer, or a function approximating to the former function; and (2) for processing the input signal thereto in accordance with at least the first transfer function in a predetermined frequency band;

(b) second signal processing means
      (1) cascaded with the first signal processing means;
      (2) having a transfer function represented by $$(1 + K \cdot \cos(\omega T)) \cdot \exp(-sT); \text{ and}$$

(3) for processing the input signal in accordance with at least the second transfer function.

2. A signal processing method according to claim 1, wherein the first transfer function includes $$\sum_{i=0}^{m} (-1)^i K_i \cdot (\cos(\omega T)) \cdot \exp(-sT)^i \cdot \exp(-(m-i)sT)$$

which includes the expansion of the function $\exp(-mST)/(1 + K \cos(\omega T))$ in geometrical series where $K_i$ is a constant.

3. A signal processing method according to claim 1, wherein the first transfer function includes $$[(1 - K_1' \cos(\omega T)) \cdot \exp(-sT)] \times [(1 + K_2 \cdot \cos^2(\omega T)) \cdot \exp(-2sT)]$$

which includes a factorized version of the sum of a first to a third term taken from an expansion of the function $\exp(-msT)/(1 + K \cdot \cos(\omega T))$ in geometrical series where $K_1$ and $K_2$ are constants.

4. A signal processing method according to claim 1, wherein the first transfer function includes $$\sum_{i=0}^{m} (-1)^{m+1} \cdot k_i \cdot [\exp(-isT) + \exp(-(2m-i)sT)]$$

obtained by expanding the function $\exp(-msT)/(1+K\cdot\cos(\omega T))$ in geometrical series where $K_i$ is a constant.

5. A signal processing method in which an input signal of a first frequency characteristic is converted to a signal of a second predetermined frequency characteristic, and the resulting signal is recovered to a signal of the first characteristic, comprising:
(a) third signal processing means
(1) having a third transfer function given by $$(1+K\cdot\cos(\omega T))\cdot\exp(-sT)$$

where $\omega$ is the angular frequency of the input signal, s is the complex angular frequency of $j\omega$, T is a constant having the unit of time, and K is constant;
(2) for processing the input signal in accordance with at least the third transfer function in a predetermined frequency band;
(b) fourth signal processing means
(1) cascaded with the third signal processing means; and
(2) having a fourth transfer function represented by $$[(1+k_2\cdot\cos^2(\omega T))\cdot\exp(-2sT)]\times[(1+K\cdot\cos(wT))\cdot\exp(-sT)];$$

and
(3) for processing the input signal in accordance with a least the fourth transfer function.

6. A signal processing apparatus in which an input signal of a first frequency characteristic is converted to a signal of a second predetermined frequency characteristic, and the resulting signal is recovered to a signal of the first original frequency characteristic, comprising:
(a) a first signal processing network
(1) having as a first transfer function the function $$\exp(-msT)/(1+K\cdot\cos(\omega T))$$

where $\omega$ is the angular frequency of the input symbol, s is the complex angular frequency of $j\omega$, T is a constant having the unit of time, K is a constant equal to, or smaller than, 1 (unity) and m is an integer, or a function approximating to the former function; and
(2) for processing the input signal thereto in accordance with at least the first transfer function in a predetermined frequency band;
(b) a second signal processing network
(1) cascaded with the first signal processing means; and
(2) having a transfer function represented by $$(1+K\cdot\cos(\omega T))\cdot\exp(-sT);$$

and
(3) for processing the input signal in accordance with a least the second transfer function.

7. A signal processing apparatus according to claim 6, wherein the first signal processing network has:
(a) transfer function giving by $$\sum_{i=0}^{m}(-1)^i K_i\cdot(\cos(\omega T)\cdot\exp(-sT))^i\cdot\exp(-(m-i)sT)$$

(b) an amplitude characteristic represented by $$1/(1+K\cdot\cos(\omega T))$$

and includes
(c) means for adjusting the factor of K such that the transfer function approximates the amplitude characteristic.

8. A signal processing apparatus according to claim 6, wherein the first processing network has:
(a) a transfer function given by $$[(1-K_1\cdot\cos(\omega T))\cdot\exp(-sT)]\times[(1+K_2\cdot\cos^2(\omega T))\cdot\exp(-2sT)]$$

and
an amplitude characteristic represented by $$1/(1+K\cdot\cos(\omega T))$$

and includes
(b) means for adjusting the values of the factors $K_1$ and $K_2$ such that the transfer function approximates the amplitude characteristic.

9. A signal processing apparatus according to claim 8, wherein the first signal processing network includes:
(a) a third signal processing network including $$(1-K_2\cdot\cos(\omega T))\cdot\exp(-sT);$$

and
(b) a fourth signal processing network having $$(1+K_2\cdot\cos^2(\omega W))\cdot\exp(-2sT)$$

as a transfer function; and
cascaded with the third signal processing network.

10. A signal processing apparatus according to claim 6, wherein the second signal processing network includes:
(a) a cosine circuit
(1) including a resistor and an impedance circuit or an admittance circuit connected in series, each of the impedance circuit and admittance circuit including a ladder network of inductance elements and capacitance elements;
(2) having an amplitude characteristic represented by a cosine function of $\cos(\omega T)$; and
(b) signal addition ratio adjusting means for adding a signal including a version of the input signal delayed by a predetermined time of T, and a signal including a version of the input signal which has passed through the cosine circuit and for adjusting the addition ratio.

11. A signal processing apparatus according to claim 7, wherein the first signal processing network includes:
(a) a cosine circuit
(1) including a resistor and an impedance circuit or an admittance circuit connected in series, each of the impedance circuit and admittance circuit including a ladder network of inductance elements and capacitance elements;
(2) having an amplitude characteristic represented by a cosine function of $\cos(\omega T)$; and
(b) signal addition ratio adjusting means for adding a signal including a version of the input signal delayed by a predetermined time of T, and a signal including a version of the input signal which has passed through the cosine circuit and for adjusting the addition ratio.

12. A signal processing apparatus according to claim 8, wherein the first signal processing network includes:

(a) a cosine circuit
  (1) including a resistor and an impedance circuit or an admittance circuit connected in series, each of the impedance circuit and admittance circuit including a ladder network of inductance elements and capacitance elements;
  (2) having an amplitude characteristic represented by a cosine function of $\cos(\omega T)$; and
(b) signal addition ratio adjusting means for adding a signal including a version of the input signal delayed by a predetermined time of T, and a signal including a version of the input signal which has passed through the cosine circuit and for adjusting the addition ratio.

13. A signal processing apparatus according to claim 9, wherein the third signal processing network includes:
(a) a cosine circuit
  (1) including a resistor and an impedance circuit or an admittance circuit connected in series, each of the impedance circuit and admittance circuit including a ladder network of inductance elements and capacitance elements;
  (2) having an amplitude characteristic represented by a cosine function of $\cos(\omega T)$; and
(b) signal addition ratio adjusting means for adding a signal including a version of the input signal delayed by a predetermined time of T, and a signal including a version of the input signal which has passed through the cosine circuit and for adjusting the addition ratio.

14. A signal processing apparatus according to claim 8, wherein the first signal processing network includes:
(a) a square cosine circuit
  (1) including an impedance circuit and an admittance circuit connected in series, each of the impedance circuit and admittance circuit including ladder network of inductance elements and capacitance elements;
  (2) having an amplitude characteristic represented by a square cosine function of $\cos^2(\omega T)$; and
(b) signal addition ratio adjusting means for adding a signal including a version of the input signal delayed by a predetermined time of 2T, and a signal including a version of the input signal which has passed through the square cosine circuit and for adjusting the addition ratio.

15. A signal processing apparatus according to claim 9, wherein the fourth signal processing network includes:
(a) a square cosine circuit
  (1) including an impedance circuit and an admittance circuit connected in series, each of the impedance circuit and admittance circuit including a ladder network of inductance elements and capacitance elements;
  (2) having an amplitude characteristic represented by a square cosine function of $\cos^2(\omega T)$; and
(b) signal addition ratio adjusting means for adding a signal including a version of the input signal delayed by a predetermined time of 2T, and a signal including a version of the input signal which has passed through the square cosine circuit and for adjusting the addition ratio.

16. A signal processing apparatus according to claim 6, wherein the first signal processing network includes:
(a) delay means including 2m cascaded delay circuits, each having a delay time of T: and
(b) signal addition ratio adjusting means for additing:
a first delayed output signal including the addition of the input signal and the output signal from the $2m^{th}$ delay circuit delayed by a time of 2by the first 2m delay circuits;
an $(i+1)^{th}$ delayed output signal including the addition of the output signal from the $i^{th}$ delay circuit and the output signal from the $(2m-i)^{th}$ delay circuit where i is an integer which is equal to, or greater than 1 (unity) and which is equal to, or smaller than, m−1; and
an $(m+1)^{th}$ delay output signal from the $m^{th}$ delay circuit; and
for adjusting the addition ratio.

17. A signal processing apparatus in which an input signal of a first frequency characteristic is converted to a signal of a second predetermined frequency characteristic and the resulting signal is reconverted to a signal of the first frequency characteristic, comprising:
(a) a third signal processing network
  (1) having a third transfer function given by $$(1+K\cdot\cos(\omega T))\cdot\exp(-sT)$$

where $\omega$ is the angular frequency of the input signal, s is a complex angular of $j\omega$, T is a constant having the unit of time, and K is constant;
  (2) for processing the input signal thereto in accordance with the third transfer function in a predetermined frequency band;
(b) a fifth signal processing network
  (1) cascaded with the third signal processing network; and
  (2) having a fourth transfer function given by $$[(1+k_2\cdot\cos^2(\omega T))\cdot\exp(-2sT)] \times$$
$$[(1+K\cdot\cos(\omega T))\cdot\exp(-sT)]$$

18. A signal processing apparatus according to claim 17, wherein the fifth signal processing network includes:
(a) a second signal processing network having $$(1+K\cdot\cos(\omega T))\cdot\exp(-sT);$$
and (b) a fourth signal processing network
  1) having a transfer function given by $$(1+K_2\cdot\cos^2(\omega T))\cdot\exp(-2sT);$$
and (2) cascaded with the second signal processing network.

19. A signal processing apparatus according to claim 17, wherein the third signal processing network includes:
(a) a cosine circuit
  (1) including a resistor and an impedance circuit or an admittance circuit connected in series, each of the impedance circuit and admittance circuit including a ladder network of inductance elements and capacitance elements
  (2) having an amplitude characteristic represented by a cosine function of $\cos(\omega T)$; and
(b) signal addition ratio adjusting means for adding a signal including a version of the input signal delayed by a predetermined time of T, and a signal including a version of the input signal which has passed through the cosine circuit and for adjusting the addition ratio.

20. A signal processing apparatus according to claim 18, wherein the second signal processing network includes:
   (a) a cosine circuit
      (1) including a resistor and an impedance circuit or an admittance circuit connected in series, each of the impedance circuit and admittance circuit including a ladder network of inductance elements and capacitance elements
      (2) having an amplitude characteristic represented by a cosine function of $\cos(\omega T)$; and
   (b) signal addition ratio adjusting means for adding a signal including a version of the input signal delayed by a predetermined time of T, and a signal including a version of the input signal which has passed through the cosine circuit and for adjusting the addition ratio.

21. A signal processing apparatus according to claim 18, wherein the fourth signal processing network includes:
   (a) a square cosine circuit
      (1) including an impedance circuit and an admittance circuit connected in series, each of the impedance circuit and admittance circuit including a ladder network of inductance elements and capacitance elements
      (2) having a amplitude characteristic represented by a square cosine function of $\cos^2(\omega T)$; and
   (b) signal addition ratio adjusting means for adding a signal including a version of the input signal delayed by a predetermined time of 2T, and a signal including a version of the input signal which has passed through the square cosine circuit and for adjusting the addition ratio.

22. A signal processing apparatus according to claim 6, wherein
   (a) the first signal processing includes a sixth cascaded signal processing network having a transfer function given by $(1+sT_1)/(1+sT_2)$;

and (b) the second signal processing network includes a seventh cascaded signal processing network having a transfer function given by $(1+sT_2)/(1+sT_1)$.

where $T_1$ and $T_2$ are a constant having the unit of time and $T_1$ is greater than $T_2$.

23. A signal processing apparatus according to claim 17, wherein
   (a) the third signal processing includes a sixth cascaded signal processing network having a transfer function given by $(1+sT_1)/(1+sT_2)$;

and (b) the fifth signal processing network includes a seventh cascaded signal processing network having a transfer function given by $(1+sT_2)/(1+sT_1)$.

where $T_1$ and $T_2$ are a constant having the unit of time and $T_1$ is greater than $T_2$.

* * * * *